United States Patent
Flixeder et al.

(10) Patent No.: US 11,245,348 B2
(45) Date of Patent: Feb. 8, 2022

(54) METHOD FOR CONTROLLING A LONG-STATOR LINEAR MOTOR

(71) Applicant: B&R INDUSTRIAL AUTOMATION GMBH, Eggelsberg (AT)

(72) Inventors: Stefan Flixeder, Eggelsberg (AT); Stefan Huber, Eggelsberg (AT); Alexander Almeder, Eggelsberg (AT)

(73) Assignee: B&R INDUSTRIAL AUTOMATION GMBH, Eggelsberg (AT)

( * ) Notice: Subject to any disclaimer, the term of this patent is extended or adjusted under 35 U.S.C. 154(b) by 0 days.

(21) Appl. No.: 16/811,260

(22) Filed: Mar. 6, 2020

(65) Prior Publication Data
US 2020/0287493 A1    Sep. 10, 2020

(30) Foreign Application Priority Data
Mar. 7, 2019  (EP) ..................................... 19161181

(51) Int. Cl.
*H02P 25/064*   (2016.01)
*G01R 31/34*    (2020.01)

(52) U.S. Cl.
CPC .......... *H02P 25/064* (2016.02); *G01R 31/343* (2013.01)

(58) Field of Classification Search
CPC .......................... H02P 25/064; G01R 31/343
See application file for complete search history.

(56) References Cited

U.S. PATENT DOCUMENTS

| 6,876,107 B2 | 6/2005 | Jacobs |
| 2015/0022030 A1* | 1/2015 | Rohner ................. H02K 41/02 310/12.19 |

(Continued)

FOREIGN PATENT DOCUMENTS

| EP | 2 860 496 | 4/2015 |
| EP | 3 251 986 | 12/2017 |

(Continued)

OTHER PUBLICATIONS

Hiller, "Ferraris Acceleration Sensor—Principle and Field of Application in Servo Drives", Hubner Elektromaschinen AG, Berlin, Germany, downloaded from Internet: URL:https://pdfs.semanticscholar. org/ecfb/5b98a45473797e8e47f09f_8f0c8a50f4bbd1.pdf?ga=2. 15626614.1718334140.1567668397-330839178.1567521626 [downloaded on Sep. 5, 2019], Dec. 30, 2003, pp. 1-6.

(Continued)

*Primary Examiner* — Zoheb S Imtiaz
(74) *Attorney, Agent, or Firm* — Greenblum & Bernstein, P.L.C.

(57) ABSTRACT

In order to improve control of a long-stator linear motor, a first measured value is ascertained in a first measurement section and a second measured value is ascertained in a second measurement section, in each case along a transport path in a movement direction. The first measurement section overlaps, in the movement direction, the second measurement section in an overlap region, and the first measured value and the second measured value represent the same actual value of a physical quantity. An operating parameter of the long-stator linear motor determined based on a deviation occurring between the first measured value and the second measured value.

15 Claims, 2 Drawing Sheets

(56) References Cited

U.S. PATENT DOCUMENTS

| | | | |
|---|---|---|---|
| 2015/0365041 A1* | 12/2015 | Reynolds | H02P 29/10 |
| | | | 318/490 |
| 2017/0054398 A1 | 2/2017 | Hanaka | |
| 2017/0346379 A1 | 11/2017 | Weber et al. | |
| 2018/0113002 A1* | 4/2018 | Shimizu | H02K 11/215 |
| 2018/0248498 A1 | 8/2018 | Piitulainen et al. | |
| 2020/0287493 A1* | 9/2020 | Flixeder | B65G 54/02 |

FOREIGN PATENT DOCUMENTS

| | | | |
|---|---|---|---|
| EP | 3 367 068 | | 8/2018 |
| JP | 2014-196940 | | 10/2014 |
| WO | 2008/072525 | | 6/2008 |
| WO | WO2008072525 | * | 6/2008 |

OTHER PUBLICATIONS

Official Communication issued in European Patent Office (EPO) Patent Application No. 19161181.3, dated Sep. 5, 2019.

* cited by examiner

METHOD FOR CONTROLLING A LONG-STATOR LINEAR MOTOR

CROSS-REFERENCE TO RELATED APPLICATIONS

The present application claims priority under 35 U.S.C. § 119(a) of Europe Patent Application No. 19161181.3 filed Mar. 7, 2019, the disclosure of which is expressly incorporated by reference herein in its entirety.

BACKGROUND

1. Field of the Invention

The present invention relates to a method for controlling a long-stator linear motor, a first measured value being ascertained in a first measurement section and a second measured value being ascertained in a second measurement section, in each case along a transport path in a movement direction.

2. Discussion of Background Information

A long-stator linear motor (LLM) comprises a plurality of electric drive coils which form one or more stator(s) and are arranged next to one another in a stationary manner on one side, two sides or more than one side along a transport path. Furthermore, a number of excitation magnets are each arranged on transport units as permanent magnets or as an electrical coil or as a short-circuit winding. The magnets are usually attached to the transport unit on one side, two sides or more sides in the movement direction such that they can interact with the drive coils of the stator. The long-stator linear motor can be in the form of a synchronous machine, both self-excited or externally excited, or in the form of an asynchronous machine. Owing to the interaction of the (electro)magnetic fields of the magnets and the drive coils, a propulsive force acts on the magnets of the transport unit, which in turn moves the transport unit in the movement direction. This is done by activating the individual drive coils to adjust the magnetic flux, which influences the amount of the propulsive force. Long-stator linear motors are increasingly being used as a replacement for conventional continuous conveyors or rotary-to-linear translation units (e.g. rotary motor on conveyor belt, transmission belts or chains) in order to meet the requirements of modern, flexible logistics units. A transport unit must, of course, be guided along the transport path and held thereon in a suitable manner. Any given guide elements of the transport units can interact with guide elements of the transport path; for example rollers, wheels, sliding elements or guide surfaces can be used. These guide elements can also be arranged on one side, two sides or more sides. In order to adjust the positions of the transport units on the stator, an actual position is of course also required in addition to a target position. The device for detecting the actual position and for specifying the actual position can be integrated into the long-stator linear motor or can also be implemented external.

The position, speed and acceleration of the transport units or another physical quantity of the entire transport path can be ascertained as a whole. This can be interpreted in such a way that a measurement section is provided which covers the entire transport path. A measurement section comprises one or more measuring sensors for detecting a measured value. Each measured value represents an actual value of a physical quantity. For example, a position of a transport unit in the measurement section can be determined as a measured value, by means of which the actual position is represented as a physical quantity. This can be done directly in the measurement section by means of position sensors. Position observers, which determine the position based on other information such as voltages and currents, can also be provided.

If only one measurement section is thus provided, the transport path can only have a one-dimensional topology, i.e. a concentricity or a line. The transport path can then accordingly not comprise any switches, since the measurement section would otherwise have to overlap itself. In contrast, the transport path of a long-stator linear motor can also be assembled from a plurality of measurement sections. Usually, but not necessarily, each measurement section covers one transport segment or part of a transport segment. A transport segment denotes a modular section of the transport path and comprises a number of drive coils. The measurement sections are usually spaced apart from one another along the transport path in the movement direction or are arranged adjacent to one another.

In order to ascertain a global actual position of a transport unit, the measurement section at which a transport unit is located in each case can first be ascertained. Furthermore, an actual section position on the relevant measurement section can be ascertained. The individual actual section positions are merged into a global actual position on the transport path. This enables the transport unit to be assigned a unique global actual position, for example in relation to a selected reference point. If the measurement sections together cover the transport path of the linear motor completely, the transport units can be assigned a unique actual position in relation to an (arbitrary) reference point at any time. This is called a complementary sensor data fusion, and is known for example from U.S. Pat. No. 6,876,107 B2. The individual measurement sections complement one another and are arranged side-by-side without gaps.

SUMMARY

The problem addressed by the present invention is that of improving the control of the long-stator linear motor.

The problem is solved according to the invention by the first measurement section overlapping, in an overlap region in the movement direction, the second measurement section, the first measured value and the second measured value representing the same actual value of a physical quantity and an operating parameter of the long-stator linear motor being determined based on a deviation occurring between the first measured value the second measured value.

By overlapping the measurement sections, redundant measured values are generated in the overlap region. The relevant measured value can be ascertained or observed in the associated measurement section by a sensor, or also by the interaction of sensors in the relevant measurement section. It is determined whether and to what extent the first measured value of the first measurement section deviates from the second measured value of the second measurement section, it being of course possible for a tolerance to be provided. If a deviation occurs, it is used to determine an operating parameter. The first and/or the second measured value can be used to determine the operating parameter. The first and the second measured value themselves have to represent only the physical quantity. This does not mean that the measured values must directly constitute the same physical quantity. For example, the first measured value can directly describe an actual position and the second measured value can describe a current, from which in turn the actual position is determined. Thus, the first measured value directly represents the actual position as a physical quantity and the second measured value indirectly represents the actual position as a physical quantity.

Of course, the method according to the invention is not limited to two measured values of which each comes from an associated measurement section. One measured value each from more than two overlapping measurement sections can also be used to ascertain the operating parameter, or also a plurality of measured values from two or more overlapping measurement sections.

The measurement sections can be provided on opposite sides of the transport path.

Although this results in an overlap region when viewed in the movement direction, the measurement sections can be arranged at a distance from one another in a direction transverse to the movement direction. Such arrangements can be found in particular in long-stator linear motors having double combs. Double-comb long-stator linear motors are characterized by two drive sides arranged along the transport path, one stator being provided per drive side. Drive coils are thus arranged on each side. Accordingly, excitation magnets are provided on both sides of a transport unit, each of which magnets cooperates with the drive coils on one side.

The measurement sections can also be provided on the same side of the transport path.

The configuration can be provided in which the sensors of two measurement sections are arranged so as to overlap in the movement direction. However, the sensors associated with the respective measurement sections are often arranged so as not to overlap. Nevertheless, the measurement sections indicate the visual range of the sensors and not the physical extent of the sensors themselves. In general terms, overlapping measurement sections mean an overlap of the fields of view of the sensors, it being possible for the sensors themselves to also overlap. Of course, this also applies to measurement sections that are arranged on opposite sides of the transport path.

Of course, a plurality of measurement sections can also be arranged along a transport path such that there is a mixture of overlap regions on opposite sides and on the same side of the transport path. A third measured value from a third measurement section can also be compared with the first and the second measured values or further measured values from further measurement sections, etc.

An approximation of the actual value is advantageously determined as the operating parameter.

This approximation can of course be carried out over the entire overlap region for occurring actual values, a first and a second measured value being used for the respective actual values.

The first or the second measured value can be selected as an approximation of the actual value.

This corresponds to a selective process, which enables a particularly rapid approximation of the actual value. This means that even if one measurement section fails in the overlap region, the other measurement section can continue to deliver measured values, thus preventing failure of the entire long-stator linear motor.

The first or the second measured value can be selected based on a classification of the relevant measured value and/or an expected accuracy of the respective measured values.

The first or the second measured value can be selected as an approximation of the actual value based on an existing classification of the measured value or of the measurement section. For example, the measured value which can be assumed to be more accurate due to the classification can thus be selected.

A selection of one of the measured values can also be made based on the accuracy of the measured values. For example, it can be assumed that the accuracy at the edge of an associated measurement section drops, as a result of which the position of the determined measured value in relation to the measurement section can be incorporated into the selection of the measured value. A decrease in the accuracy of the measured values with increasing distance between the sensor and the measurement object can also be taken into account in the selection as a geometry factor. In the case of opposite measurement sections, the measured values from the measurement section to which a transport unit is closer can be selected, for example.

The selection of a measured value can also be made using learning algorithms, such as neural networks.

As mentioned, the actual value of a physical quantity is represented by measured values in both measurement sections. Since there are two measured values, the actual value cannot be clearly determined, as a result of which the measured values are preferably processed in order to approximate the actual value. The actual value can thus be determined with increased accuracy, since not only one measured value from one measurement section, but measured values from two (or more) measurement sections serve as the basis. This is known as competing sensor data fusion. The actual value to be selected can be determined based on an existing classification of the measured value or of the measurement section. The actual value can also be approximated, for example, by averaging the measured values.

Advantageously, however, the first and the second measured values are each provided with a weighting factor and the approximation of the actual value is ascertained as the operating parameter from the first and the second measured values and from the associated weighting factor in each case.

In contrast to a selective method, one measured value is not selected as an approximation of the actual value. Instead, both measured values are taken into account, both measured values being weighted in each ease. The actual value can be approximated even better by using a weighting factor for the respective measured values.

The weighting factor can also comprise a model factor, which is determined by the magnitude of a deviation of the measured value from a reference model.

The model factor can thus be determined based on a reference model, it being possible, for example, for the model to represent a physical behavior. For example, the equations of motion of a transport unit can be used for the modeling and the deviation of the real motion determined by the measured values can be incorporated into the model factor. The greater the deviation between a measured value and the model, the more likely this measured value is incorrect. The model factor can be selected based on this. This can occur in particular in opposite measurement sections since although these overlap in the movement direction, they can nevertheless be spaced apart from one another in the transverse direction, which has a high probability of being able to deliver different measured values.

The weighting factor can comprise a geometry factor, which is determined by the position of the measured value in the measurement section.

For example, it can be assumed that the accuracy of the measured values at the edge of an associated measurement section drops, as a result of which the position of the ascertained measured value in relation to the measurement section can be incorporated into the geometry factor. Measured values at the edge of the measurement section are thus weighted less, for example, than measured values in the center of the measurement section. A decrease in the accuracy of the measured values with increasing distance between the sensor and the measurement object can also be taken into account as a geometry factor. In the case of opposite measurement sections, the measured values from the measurement section to which a transport unit is closer can be weighted higher, for example.

The weighting factor can comprise a statistical factor which is determined by a statistical distribution function.

The statistical factor can take into account, for example, parameterized random distribution of the measurement signals, it being possible for the variance of the measured values to be estimated. This can be done in particular when determining the actual position by assuming that the variance increases as the distance between the magnetic plate of the transport unit and the position sensor increases. This is particularly expedient in combination with a geometric weighting factor.

The weighting factors can also be used by learning algorithms, such as neural networks. Any combination of the factors and methods mentioned can of course be used to determine the weighting functions.

In each case, a measurement position of a transport unit on the transport path can be ascertained as the first and the second measured value.

The actual position as the actual value can thus be represented in each case by the measurement positions as the measured values and thus the control of the transport units can thus be improved since the actual position can be determined more accurately by taking into account the measured values from a plurality of measurement sections.

Likewise, in each case a speed and/or an acceleration of a transport unit on the transport path and/or in each case a temperature and/or a current can be ascertained as the first and the second measured value.

The occurrence of interference and/or an error and/or wear on the long-stator linear motor can be determined as the operating parameter from the deviation of the first and second measured values.

If interference, an error or wear occurs, the first measured value and the second measured value can deviate from one another over a predefined tolerance. A corresponding deviation can thus be used to deduce interference, an error or wear.

The measured values can be reliably detected and/or reliably evaluated. "Reliable" can be defined according to a category in table 10 of the standard DIN EN ISO 13849-1: 2016-06 and thus, depending on the safety category, single-fault safety, double-fault safety, etc. can be provided.

An action can be triggered when interference, an error or wear is detected. An emergency stop, the output of an (e.g. acoustic or optical) signal, the setting of a flag, etc. can be carried out as an action.

Mechanical assembly errors, but also failures (e.g. of a measurement section due to a sensor error or a magnetic disk loss) can be regarded as errors. It is also possible to ascertain parameters that have been initialized incorrectly, for example an incorrect definition of a measurement section, as a result of which the measured value from said measurement section differs accordingly from the measured value from an overlapping measurement section.

Incorrect assembly of transport segments can lead to incorrect positioning of a transport unit on the transport path, which can interfere with higher-level processes, in particular the adjustment of the positions or trajectories of the transport units. This can result in discontinuous manipulated variables, unstable control loops, overcurrent errors, contouring error truncations, etc. There may also be occasions where control loops partially correct themselves against one another, which in turn can create unstable control loops and can also result in an increased energy requirement. A deviation of the measured values in the overlap region can be used to infer such incorrect assembly of transport segments, in particular if each of the measurement sections covers a transport segment.

Interferences such as environmental conditions (e.g. increased temperature) can also be identified in the same way, since these influence the measured values of the sensors of individual measurement sections. Furthermore, the failure of a measurement section or a part of a measurement section (sensor failure, magnetic disk loss, . . . ) can be identified.

A deviation of the measured values can also be used to identify, for example, wear on guide elements, such as rollers, in particular in the case of measurement sections positioned opposite one another. A change in the distance of the moving parts from the relevant measurement section can be identified based on different measured values. In the case of deviating measured values from overlapping measurement sections, this allows conclusions to be drawn about one-sided wear of the guide elements (e.g. rollers), magnetic disk loss, demagnetization of a magnetic disk, sensor malfunction (e.g. sensor drift).

It can also be ascertained on which side the transport unit has a smaller distance from the transport path. This can also occur, for example, by means of one-sided wear. This information can be used for targeted actuation of the drive coils on the side having the smaller distance, as a result of which energy can be saved and losses that occur can also be reduced.

Other exemplary embodiments and advantages of the present invention may be ascertained by reviewing the present disclosure and the accompanying drawing.

BRIEF DESCRIPTION OF THE DRAWINGS

The present invention is described in greater detail below with reference to FIG. 1 to 2B, which show advantageous embodiments of the invention by way of example in a schematic and non-limiting manner. In the drawings.

DETAILED DESCRIPTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
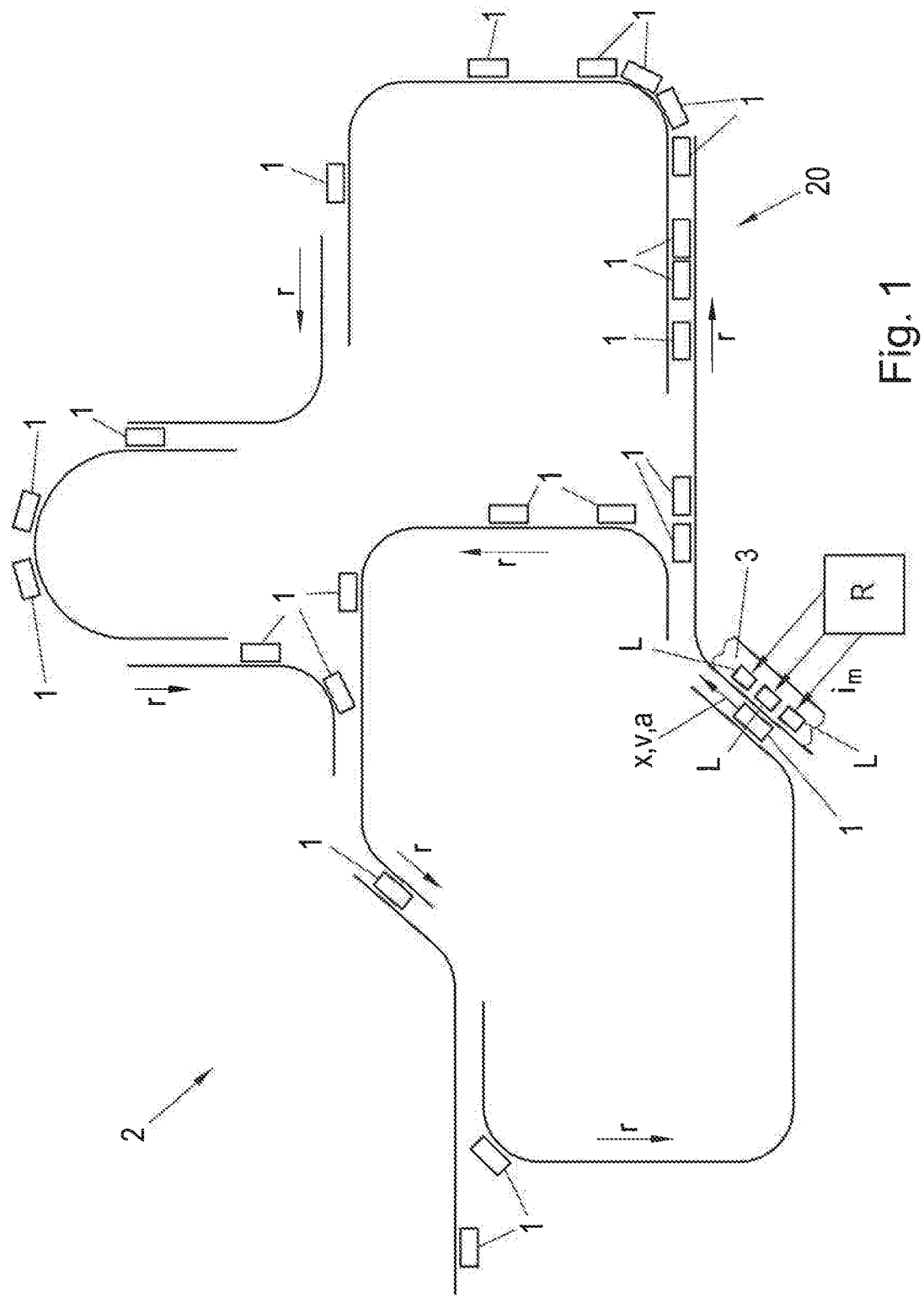
FIG. 1 shows a long-stator linear motor.

FIG. 1 shows a long-stator linear motor 2, the stator of the long-stator linear motor 2 being, by way of example, in the form of a closed transport path 20. A plurality of drive coils L are arranged one after the other on the transport path 20 in the direction of movement r of a transport unit 1, each of which coils is energized in normal operation under the control of a control unit R at a coil current $i_m$ in order to generate a moving magnetic field. The coil current $i_m$ through the respective drive coils L can be fundamentally different from drive coil L to drive coil L. The control unit R can be in the form of suitable hardware and/or in the form of software running on suitable hardware. The drive coils L arranged next to one another in the movement direction r are arranged on the transport path 20 on a stationary support structure 3 (only implied in the drawings). Depending on the application and as needed, the transport path 20 can have any shape, and can comprise closed and/or open path sections. The transport path 20 can lie in one plane, but can also be guided in space as desired.

A transport path 20 usually consists of a plurality of assembled transport segments, each having a number of drive coils L. Likewise, switches can also be used to guide a transport unit 1 from a first transport segment 20 to a second transport segment.

A transport unit 1 must, of course, be guided along the transport path 20 and held thereon in a suitable manner. Any given guide elements of the transport unit 1 can interact with guide elements of the transport path 20, it being possible to use rollers, wheels, sliding elements or guide surfaces, for example. These guide elements can also be arranged in sections on one side, two sides or on more than one side.

Measurement sections 21, 22 are arranged along the transport path 20 of the long-stator linear motor 2, each measurement section 21, 22 extending over part of the transport path 20. A measurement section 21, 22 can extend over a plurality of successive transport segments, or can also be limited to only one transport segment. Of course, a measurement section 21, 22 can also protrude beyond a transport segment or be considered independently of transport segments. For this reason, measurement sections 21, 22 and not transport segments are considered in the present description. For reasons of clarity, the measurement sections 21, 22 are not indicated in FIG. 1. Instead, part of the transport path 20 is considered in FIGS. 2A and 2B, overlapping measurement sections 21, 22 being shown in each case.

A measurement section 21, 22 is designed to ascertain one or more measured values m1, m2, each measured value m1, m2 representing an actual value X of a physical quantity G. An actual position x and/or an actual speed v and/or an actual acceleration a of a transport unit 1 can be considered to be the physical quantity G. A measured value m1, m2 thus constitutes a measurement position, a measurement speed or a measurement acceleration, and thus represents an actual position x, an actual speed v, or an actual acceleration a, it not being necessary for both measured values m1, m2 to directly constitute the same physical quantity G, but only to represent said quantity.

If an actual position is ascertained as the physical quantity G, this can be done with reference to a reference point, it being possible for the reference point to be assumed at a measurement section 21, 22, a transport segment or any other point in space. Other physical quantities G, such as a prevailing force, a flowing current or a prevailing temperature can also be represented by the measured values m1, m2. From this, a physical quantity G, such as an actual position x, can in turn be calculated, which can also be carried out by an observer.

A first measured value m1 can also directly represent a physical quantity G, for example the actual position. This means that the first measured value m1 constitutes the actual position itself. A second measured value m2, in contrast, can constitute a different physical quantity, for example an electric current, from which the actual position is represented as the physical quantity G. The first measured value m1 thus describes the physical quantity G directly and the second measured value m2 describes the physical quantity G indirectly. However, both measured values m1, m2 represent the physical quantity G.

Magnetic field sensors, for example Hall sensors or magnetoresistive sensors can thus be provided as sensors. However, the sensors can also use other physical measurement principles, such as optical sensors, capacitive sensors or inductive sensors. Current sensors which determined the coil current $i_m$ through a drive coil L can also be provided. As is known, a normal force and/or propulsive force acting on a transport unit 1 can be determined from the coil current $i_m$. A temperature sensor can also be provided as the sensor.

Figure 2A:
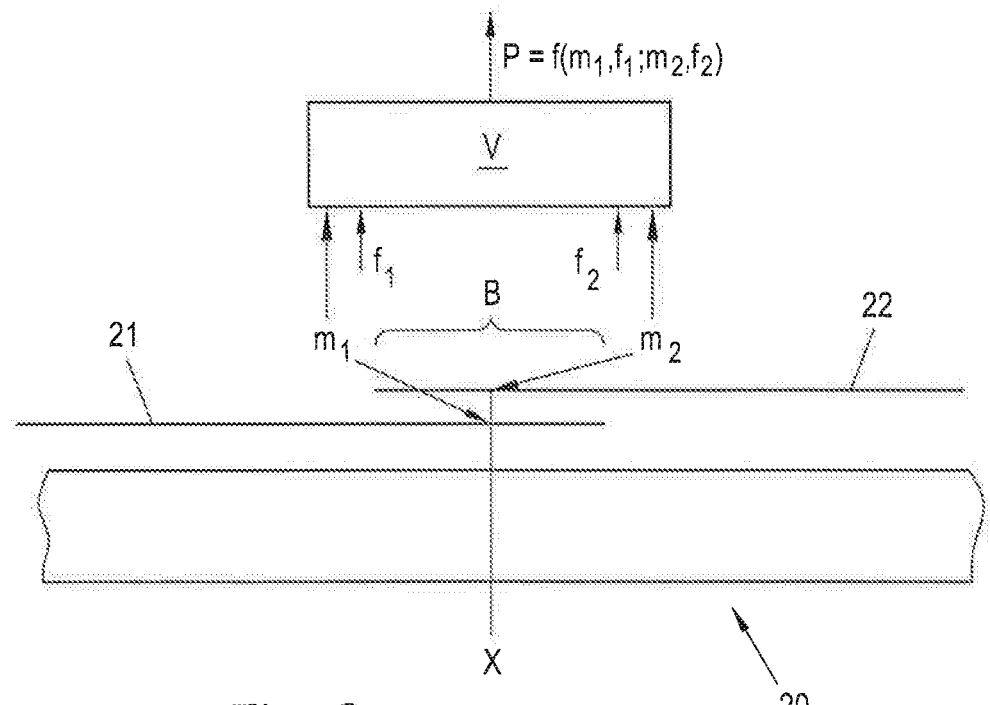
FIG. 2A shows two measurement sections on the same side of the transport path.

A first and a second measurement section 21, 22 are shown by way of example in FIG. 2A. According to the invention, at least two measurement sections 21, 22 have an overlap region B in the movement direction r, i.e. along the transport path 20. The measurement sections 21, 22 overlapping in an overlap region B can be arranged on the same side of the transport path 20 as in FIG. 2A, or also on opposite sides of the transport path 20, as shown in FIG. 2B.

In both cases shown, a first measured value m1 in the first measurement section 21 is ascertained in the overlap region B and a second measured value m2 in the second measurement section 22 is ascertained in the overlap region B. Both measured values m1, m2 represent the same actual value X of a physical quantity G. For example, an actual position x of a transport unit 1 can be represented as an actual value X by the first measured value m1 of the first measurement section 21. Analogously, the actual position x of the transport unit 1 can also be represented as the actual value X by the second measured value m2 of the second measurement section 22, i.e. as the second actual measurement position.

Figure 2B:
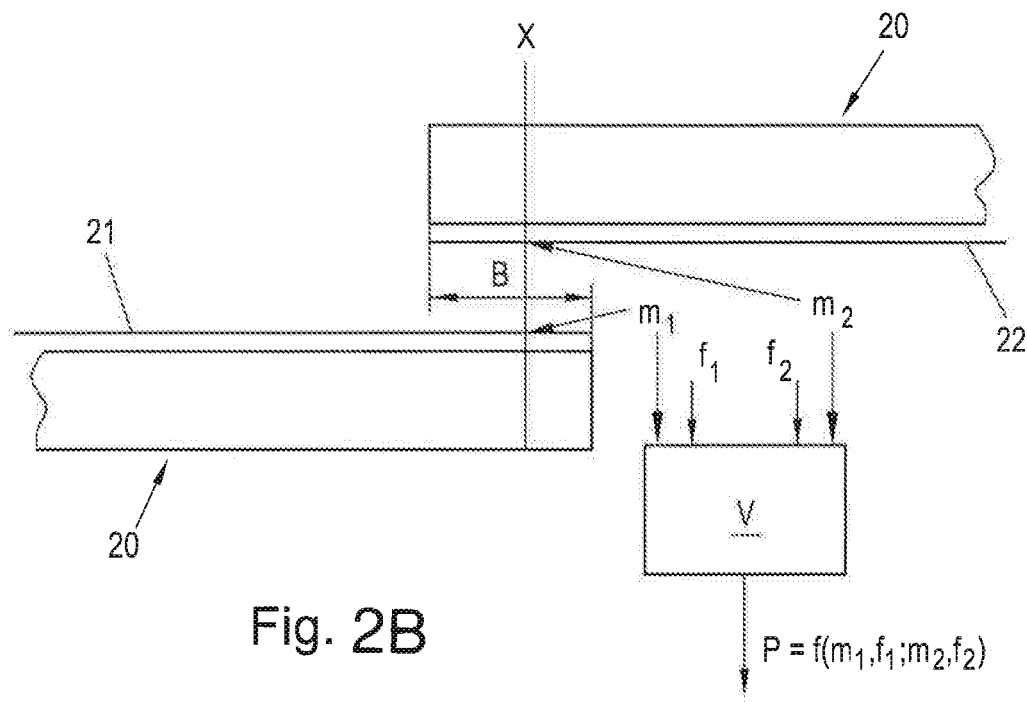
FIG. 2B two measurement sections on opposite sides of the transport path.

Only one actual value X is shown in FIGS. 2A and 2B, but of course other and/or further actual values X can also be ascertained in the overlap region B, measured values m1, m2 which represent the other/further actual values X being determined in each case.

If the first measured value m1 and the second measured value m2 differ, then an operating parameter P of the long-stator linear motor 2 can be determined from the deviation of the first measured value m1 from the second measured value m2, which gives the operating parameter P as a function of the measured values P=f(m1, m2).

This takes place in FIGS. 2A, 2B by way of example in a processing unit V, but can instead of course also take place in the control unit R or another unit already present on the long-stator linear motor 1, for example. The operating parameter P can also be output and/or processed, for example in order to control the transport units 1.

An approximation of the real actual value X can be determined, for example, as the operating parameter P from the deviation of the first and the second measured value m1, m2. This can be done by the measurement sections 21, 22 being transformed into a common coordinate system. The measured values m1, m2 can be averaged or can each be assigned a weighting factor f1, f2, which in each case gives the operating parameter P as a function of the measured values m1, m2, and the associated weighting factor f1, f2: P=f(m1, f2; m2, f2). An approximation of the actual value X can be ascertained as the operating parameter P. A weighting factor f1, f2 of a measurement section 21, 22 can be initially defined and/or adjusted over time.

The relevant measurement section 21, 22 can also contain regions of different measuring accuracy, it being possible for the measuring accuracy to be able to change discretely and/or continuously over a measurement section 21, 22 or part of the measurement section 21, 22. Likewise, the measuring accuracy of a measurement section 21, 22 can change over time and/or depending on other influences such as temperature, contamination and/or aging of the sensors. The relevant weighting factor f1, f2 can comprise a geometry factor which is determined by the position of the measured value m1, m2 in the measurement section 21, 22. For example, accuracy depending on the position on the measurement section 21, 22, the distance from the measurement object, the temperature or magnetic stray fields can be incorporated into the geometry factor. If the accuracy of the measured values m1, m2 decreases toward the edge of the measurement section 21, 22, the geometry factor can be used as a function of the distance from the center of the measurement section 21, 22.

Of course, a weighting factor f1, f2 can vary depending on the position of the measured value in relation to the measurement section 21, 22, which can also be achieved by a geometry factor.

The weighting factor f1, f2 can also comprise a statistical factor which is determined by a statistical distribution function. If the probability distributions of the individual measurement sections 21, 22 are known, independent of one another, normally distributed and have the same average value, a maximum likelihood estimator which uses weighted least squares can be used. The variance on a measurement section 21, 22 can be a function of both time and position on the measurement section 21, 22.

Model factors can also be incorporated into the weighting factors f1, f2. The Kalman filter is mentioned as an example of a model-based estimator. When designing a Kalman filter, assumptions can also be made about the probability distribution of the measured values m1, m2.

The first or the second measured value m1, m2 itself or an average value of the first or of the second measured value m1, m2 could also be selected as an approximation of the actual value X. The information mentioned above in the context of the weighting factors, which information is incorporated into the statistical factors and/or geometry factors, can equally be used for the selection of a measured value m1, m2 as an approximation of the actual value X.

The occurrence of interference and/or an error and/or wear on the long-stator linear motor 2 can be determined as the operating parameter P from the deviation of the first and the second measured value m1, m2. This is possible if the measured values m1, m2 of overlapping measurement sections 21, 22 deviate from one another due to the interference, or the error, or the wear. By implication, the interference or the error or the wear can be inferred. For example, the nature of the interference, the fault or the wear can be inferred based on the magnitude of the deviation. Changed environmental conditions, such as an increased temperature, can also be regarded as interferences.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The invention claimed is:

1. A method for controlling a long-stator linear motor, by a first measured value being ascertained in a first measurement section and a second measured value being ascertained in a second measurement section, in each case along a transport path in a movement direction,
   wherein the first measurement section overlaps, in an overlap region in the movement direction, the second measurement section,
   wherein the first measured value and the second measured value represent the same actual value of a physical quantity, and
   wherein an operating parameter of the long-stator linear motor is determined based on a deviation occurring between the first measured value and the second measured value.

2. The method according to claim 1, wherein the measurement sections are provided on opposite sides of the transport path.

3. The method according to claim 1, wherein the measurement sections are provided on the same side of the transport path.

4. The method according to claim 1, wherein an approximation of the actual value is determined as the operating parameter.

5. The method according to claim 4, wherein the first or the second measured value is selected as an approximation of the actual value.

6. The method according to claim 4, wherein the first or the second measured value is selected based on a classification of the respective measured values.

7. The method according to claim 5, wherein the first or the second measured value is selected based on an expected accuracy of the respective measured values.

8. The method according to claim 4, wherein each of the first and the second measured value is provided with a weighting factor, and wherein the approximation of the actual value is ascertained as the operating parameter from the first and the second measured value and from the associated weighting factor in each case.

9. The method according to claim 8, wherein the weighting factor comprises a model factor which is determined by the magnitude of a deviation of the associated measured value from a reference model.

10. The method according to claim 8, wherein the weighting factor comprises a geometry factor which is determined by the position of the relevant measured value in the associated measurement section.

11. The method according to claim 8, wherein the weighting factor comprises a statistical factor which is determined by a statistical distribution function.

12. The method according to claim 1, wherein the occurrence of interference and/or an error and/or wear on the long-stator linear motor is determined as the operating parameter.

13. The method according to claim 1, wherein in each case a position of a transport unit on the transport path is ascertained as the first and the second measured value.

14. The method according to claim 1, wherein in each case a speed and/or an acceleration of a transport unit on the transport path is ascertained as the first and the second measured value.

15. The method according to claim 1, wherein in each case a temperature and/or a current is ascertained as the first and the second measured value.

* * * * *